(12) United States Patent
Imanishi

(10) Patent No.: US 7,821,703 B2
(45) Date of Patent: Oct. 26, 2010

(54) LASER DRAWING METHOD AND APPARATUS

(75) Inventor: Shingo Imanishi, Kanagawa (JP)

(73) Assignee: Sony Corporation, Tokyo (JP)

( * ) Notice: Subject to any disclaimer, the term of this patent is extended or adjusted under 35 U.S.C. 154(b) by 124 days.

(21) Appl. No.: 12/009,028

(22) Filed: Jan. 16, 2008

(65) Prior Publication Data
US 2008/0231940 A1    Sep. 25, 2008

(30) Foreign Application Priority Data
Jan. 24, 2007    (JP) .......................... P2007-014002

(51) Int. Cl.
G02F 1/33 (2006.01)
(52) U.S. Cl. ...................................................... 359/305
(58) Field of Classification Search ................ 359/305, 359/307, 308, 310, 278, 285, 287, 279, 313, 359/290, 291, 292; 369/275.4
See application file for complete search history.

(56) References Cited

U.S. PATENT DOCUMENTS

| | | | |
|---|---|---|---|
| 5,279,775 A | 1/1994 | Thomas et al. | |
| 5,334,849 A | 8/1994 | Thomas et al. | |
| 2003/0164358 A1 | 9/2003 | Ward | |
| 2005/0170572 A1 | 8/2005 | Hongo et al. | |
| 2005/0237895 A1 | 10/2005 | Tanaka et al. | |

FOREIGN PATENT DOCUMENTS

JP    2004-087962    3/2004

OTHER PUBLICATIONS

Sandstrom and Tison: "Highly accurate pattern generation using acousto-optical deflection"; SSpie/optical/laser microlithography IV, vol. 1463, Jul. 1991, pp. 629-637.

*Primary Examiner*—Ricky L Mack
*Assistant Examiner*—Tuyen Q Tra
(74) *Attorney, Agent, or Firm*—Robert J. Depke; Rockey, Depke & Lyons, LLC

(57) ABSTRACT

A method of laser drawing includes steps of causing laser light from a light source to be incident to an acousto-optical diffraction element, and deflecting the light incident to the element by changing a frequency of a high frequency signal to be inputted to the element to diffract the light, thereby changing a diffraction angle of the diffracted light, and condensing the diffracted light emerging from the element on an object to be processed as an optical spot, thereby scanning the object with the optical spot. A diffracted light intensity control table for controlling a light intensity of the diffracted light so as to be constant independent of the diffraction angle of the diffracted light is prepared in advance, and in the deflecting step, the light intensity of the diffracted light is controlled based on the diffracted light intensity control table.

11 Claims, 5 Drawing Sheets

US 7,821,703 B2

LASER DRAWING METHOD AND APPARATUS

CROSS REFERENCES TO RELATED APPLICATIONS

The present invention contains subject matter related to Japanese Patent Application No. 2007-014002 filed in the Japanese Patent Office on Jan. 24, 2007, the entire contents of which being incorporated herein by reference.

BACKGROUND OF THE INVENTION

1. Field of the Invention

The present invention relates to a laser drawing method and a laser drawing apparatus suitably adapted to laser annealing and other laser drawings.

2. Description of Related Art

Heretofore, for example in a liquid crystal display apparatus and other flat display apparatuses, a thin film transistor (TFT) has been used for a switching element. In the liquid crystal display apparatus, an active matrix method of forming a thin film transistor in a silicon film formed on a glass substrate has been put into practical use. In micro-fabrication of such a thin film transistor, for crystallizing an amorphous silicon thin film formed on a substrate, a laser annealing method using a laser light is used. By using the laser annealing method, it is possible to make a satisfactory thin silicon film transistor in a low temperature environment at about 500° C.

In the laser annealing method, a laser light emerged from a diffraction optical system using an acousto-optical diffraction element (hereinafter referred to as an AOD) is used. In the diffraction optical system using an AOD, an ultrasonic wave is generated in the AOD with a high frequency signal (hereinafter referred to as an RF signal) inputted to the AOD, and a laser light incident to the AOD is diffracted with the wave surface of the ultrasonic wave.

Generally, by changing the frequency of an RF signal inputted to an AOD while keeping the amplitude of the RF signal constant, the diffraction angle of a laser light incident to the AOD and is diffracted with the wave surface of an ultrasonic wave generated with the inputted RF signal is changed according to the change in the frequency of the RF signal. Further, the light intensity of a diffracted light changes depending on the diffraction angle of the diffracted light, because the diffraction efficiency (the light intensity of a diffracted light/the light intensity of an incident light to the AOD) changes depending on the diffraction angle.

Here, referring to FIG. 1, description is made with respect to an example of a change in the light intensity of a diffracted laser light according to related art. FIG. 1 illustrates a change in the light intensity of a diffracted light emerging from an AOD when the frequency of an RF signal inputted to the AOD is changed linearly in a cycle as time progresses and the amplitude of the RF signal is kept constant.

In FIG. 1, the frequency of the FR signal changes periodically in a saw-tooth wave state, and on the other hand, the amplitude of the RF signal is constant regardless of time. If such an RF signal is inputted to the AOD, the light intensity of an emerging diffracted light waves as illustrated in FIG. 1. The light intensity of the diffracted light takes a lower-limit value $p_1$ at time $t_1$ and an upper-limit value $p_0$ at time $t_0$. Similarly, the light intensity of the diffracted light takes an upper limit value $p_2$ at time $t_2$. Here, $p_0 \cong p_2$. Thus, even when the frequency of the RF signal increases from $f_0$ to $f_1$ and from $f_1$ to $f_2$ with the lapse of time, the light intensity of the diffracted light does not increase correspondingly, and changes between the lower limit value $p_1$ and the upper limit value $p_2$ as illustrated in FIG. 1.

When forming a thin film transistor using a laser annealing method, if the light intensity of a diffracted laser light is changed while the diffracted laser light is deflected to scan an object to be processed with an optical spot of the diffracted laser light, uneven exposure is caused on the object, resulting in deterioration of quality, which is undesirable.

In addition, the degree of a change in the diffraction angle of a diffracted light relative to a change in the frequency of an RF signal varies depending on the frequency of the RF signal, and even if the frequency of an RF signal is linearly changed, the diffraction angle of a diffracted light does not change linearly, that is, the diffraction angle of a diffracted light does not change at a constant speed.

Here, an example of a change in the diffraction angle of a laser light according to related art is described referring to FIG. 2. FIG. 2 illustrates a change in the diffraction angle of a diffracted light emerging from an AOD when the frequency of an RF signal inputted the AOD is changed linearly in a cycle with the lapse of time.

In FIG. 2 also, the frequency of the RF signal changes periodically in a saw-tooth wave state. It is understood from FIG. 2 that if such an RF signal is inputted to the AOD, as the frequency of the RF signal increases, the diffraction angle of a diffracted light also increases. Here, at time $t_1'$, the frequency of the RF signal is $f_1'$ and the diffraction angle takes a lower limit value $\theta_1'$. At time $t_2'$, the frequency of the RF signal is $f_2'$ and the diffraction angle takes an upper limit value $\theta_2'$. Thus, as the frequency of the RF signal linearly increases from $f_1'$ to $f_2'$ with the lapse of time, the diffraction angle of the diffracted light changes non-linearly between the lower limit value $\theta_1'$ and the upper limit value $\theta_2'$. That is, even when the frequency of an RF signal inputted to an AOD is changed linearly to diffract and thereby deflect a laser light incident to the AOD at a constant angular speed, the diffraction angle of a diffracted light is not changed at a constant speed (the angular speed of a diffracted light is not constant).

This can be explained as follows. When the propagation velocity of an RF signal in an AOD is "v" and the frequency of the RF signal is "f", a distance "d" of a compressional wave formed in the AOD is expressed as d=v/f. A laser light incident to the wave surface of the compressional wave at an angle of $\theta_1$ is diffracted as a first order diffracted light in the direction of an angle of $\theta_2$ satisfying "d×sin $\theta_1$+d×sin $\theta_2$=λ", wherein λ is the wave length of the laser light. Here, when $\theta_1=\theta_2$, that is, when 2d×sin θ1=λ, the diffraction efficiency (the light intensity of a diffracted light/the light intensity of an incident light to the AOD) becomes the maximum, and generally an AOD element is arranged such that the laser light is incident to the AOD element at an angle where the diffraction efficiency becomes the maximum. When the above-described formulas are modified and $\theta_2$ is expressed as a function of "f", $\theta_2=\mathrm{Sin}^{-1}(\lambda f/v - \sin \theta_1)$. That is, the diffraction angle $\theta_2$ of a diffracted light changes non-linearly relative to linear changing of the frequency of the RF signal. That is, the angular velocity of a diffracted light when the diffracted light is deflected is not constant.

If the diffraction angle of a diffracted laser light does not change at a constant speed, that is, if the angular velocity of a diffracted light when the diffracted light is deflected is not constant, the position of an optical spot of the diffracted light on an object to be processed is not moved at a constant speed and results in exposure unevenness on the object to be processed, which is undesirable.

A laser annealing apparatus irradiating a laser light to a substrate in a low oxygen density environment is disclosed in Japanese Unexamined Patent Application Publication No. 2004-87962.

SUMMARY OF THE INVENTION

When forming a thin film transistor using a laser annealing method, if the light intensity of a diffracted laser light changes while the diffracted laser light is deflected and irradiated on an object to be processed, exposure unevenness is caused on the object. Further, if the position of an optical spot of the diffracted laser light on the object is not moved at a constant speed, exposure unevenness is also caused on the object. Because exposure unevenness causes quality deterioration, it is desirable to avoid exposure unevenness.

The present invention has been made in view of the above-described and other problems and provides a laser drawing method and a laser drawing apparatus that change the position of an optical spot of a diffracted laser light on a processing target at a constant speed and/or keep constant the light intensity of a diffracted laser light independent of the diffraction angle of the laser light.

According to an embodiment of the present invention, a method of laser drawing includes the steps of: causing a laser light from a light source to be incident to an acousto-optical diffraction element; and deflecting the light incident to the acousto-optical diffraction element by changing a frequency of a high frequency signal to be inputted to the acousto-optical diffraction element to diffract the light, thereby changing a diffraction angle of the diffracted light, and condensing the diffracted light emerging from the acousto-optical diffraction element through an intermediate optical lens system and a condensing lens on an object to be processed as an optical spot, thereby scanning the object with the optical spot of the diffracted light. A diffracted light intensity control table for controlling an amplitude of the high frequency signal to be inputted to the acousto-optical diffraction element so as to keep a light intensity of the diffracted light emerging from the acousto-optical diffraction element constant independent of the diffraction angle of the diffracted light is prepared in advance. In the deflecting step, the amplitude of the high frequency signal to be inputted to the acousto-optical diffraction element is controlled based on the diffracted light intensity control table, thereby the light intensity of the diffracted light emerging from the acousto-optical diffraction element is kept constant independent of the diffraction angle of the diffracted light.

According to another embodiment of the present invention, a method of laser drawing includes the steps of: causing a laser light from a light source to be incident to an acousto-optical diffraction element; and deflecting the light incident to the acousto-optical diffraction element by changing a frequency of a high frequency signal to be inputted to the acousto-optical diffraction element to diffract the light, thereby changing a diffraction angle of the diffracted light, and condensing the diffracted light emerging from the acousto-optical diffraction element through an intermediate optical lens system and a condensing lens on an object to be processed as an optical spot, thereby scanning the object with the optical spot of the diffracted light. A diffraction angle control table for controlling the frequency of the high frequency signal to be inputted to the acousto-optical diffraction element so as to change the diffraction angle of the diffracted light emerging from the acousto-optical diffraction element at a constant speed is prepared in advance. In the deflecting step, the frequency of the high frequency signal to be inputted to the acousto-optical diffraction element is controlled based on the diffraction angle control table, thereby the diffraction angle of the diffracted light emerging from the acousto-optical diffraction element is changed at a constant speed, so that the position of the optical spot of the diffracted light on the object is changed at a constant speed.

According to still another embodiment of the present invention, a laser drawing apparatus includes: a laser light source emitting a laser light; an acousto-optical diffraction element diffracting the light incident from the light source with inputting of a high frequency signal; an intermediate optical lens system and a condensing lens condensing the diffracted light emerging from the acousto-optical diffraction element on an object to be processed as an optical spot; and a high frequency signal output device outputting the high frequency signal to be inputted to the acousto-optical diffraction element. The high frequency signal output device changes a frequency of the high frequency signal to be inputted to the acousto-optical diffraction element to change a diffraction angle of the diffracted light to thereby deflect the diffracted light to scan an object to be processed with the optical spot of the diffracted light. The apparatus further includes a diffracted light intensity detection device detecting a light intensity of the diffracted light for each diffraction angle of the diffracted light; and a diffracted light intensity control table for controlling an amplitude of the high frequency signal to be inputted to the acousto-optical diffraction element so as to keep a light intensity of the diffracted light emerging from the acousto-optical element constant independent of the diffraction angle of the diffracted light. The table being prepared in advance using the diffracted light intensity detection device. The high frequency signal output device controls amplitude of the high frequency signal to be inputted to the acousto-optical diffraction element based on the diffracted light intensity control table, thereby a light intensity of the diffracted light emerging from the acousto-optical diffraction element is kept constant independent of the diffraction angle of the diffracted light.

According to still another embodiment of the present invention, a laser drawing apparatus includes: a laser light source emitting a laser light; an acousto-optical diffraction element diffracting the light incident from the light source with inputting of a high frequency signal; an intermediate optical lens system and a condensing lens condensing the diffracted light emerging from the acousto-optical diffraction element on an object to be processed as an optical spot; and a high frequency signal output device outputting the high frequency signal to be inputted to the acousto-optical diffraction element. The high frequency signal output device changes a frequency of the high frequency signal to be inputted to the acousto-optical diffraction element to change a diffraction angle of the diffracted light to thereby deflect the diffracted light to scan an object to be processed with the optical spot of the diffracted light. The apparatus further includes a position detection device detecting a position on the object of the optical spot of the diffracted light for each frequency of the high frequency signal; and a diffraction angle control table for controlling the frequency of the high frequency signal to be inputted to the acousto-optical diffraction element so as to change the diffraction angle of the diffracted light emerging from the acousto-optical diffraction element at a constant speed. The table is prepared in advance using the position detection device. The high frequency signal output device controls the frequency of the high frequency signal to be inputted to the acousto-optical diffraction element based on the diffraction angle control table, thereby the diffraction angle of the diffracted light emerging from the acousto-optical diffraction element is changed at a constant speed, so that a position of the optical spot of the diffracted light on the object is changed at a constant speed.

According to the present invention, the light intensity of a diffracted light emerging from an acousto-optical diffraction element can be made constant independent of the diffraction angle of the diffracted light by preparing a diffracted light intensity control table for controlling an amplitude of the high frequency signal to be inputted to the acousto-optical diffraction element so as to keep the light intensity of the diffracted light emerging from the acousto-optical diffraction element constant independent of the diffraction angle of the diffracted light and by controlling the amplitude of the high frequency signal to be inputted to the acousto-optical diffraction element based on the diffracted light intensity control table.

Further, according to the present invention, the diffraction angle of a laser light incident to an acousto-optical diffraction element and diffracted with inputting of an RF signal to the acousto-optical diffraction element can be changed at a constant speed by preparing a diffraction angle control table for controlling the frequency of the high frequency signal to be inputted to the acousto-optical diffraction element so as to change the diffraction angle of the diffracted light emerging from the acousto-optical diffraction element at a constant speed and by controlling the frequency of the RF signal to be inputted to the acousto-optical diffraction element based on the diffraction angle control table.

According to a laser drawing method and a laser drawing apparatus of the present invention, in laser drawing such as laser annealing, it is possible to keep constant the light intensity of a diffracted light emerging from an acousto-optical diffraction element independent of the diffraction angle of the diffracted light and/or to change the diffraction angle of the diffracted light at a constant speed to thereby move the position of an optical spot of the diffracted light on an object to be processed at a constant speed.

DESCRIPTION OF THE PREFERRED EMBODIMENTS

Hereinafter, referring to drawings, embodiments of the present invention are described.

Figure 3:
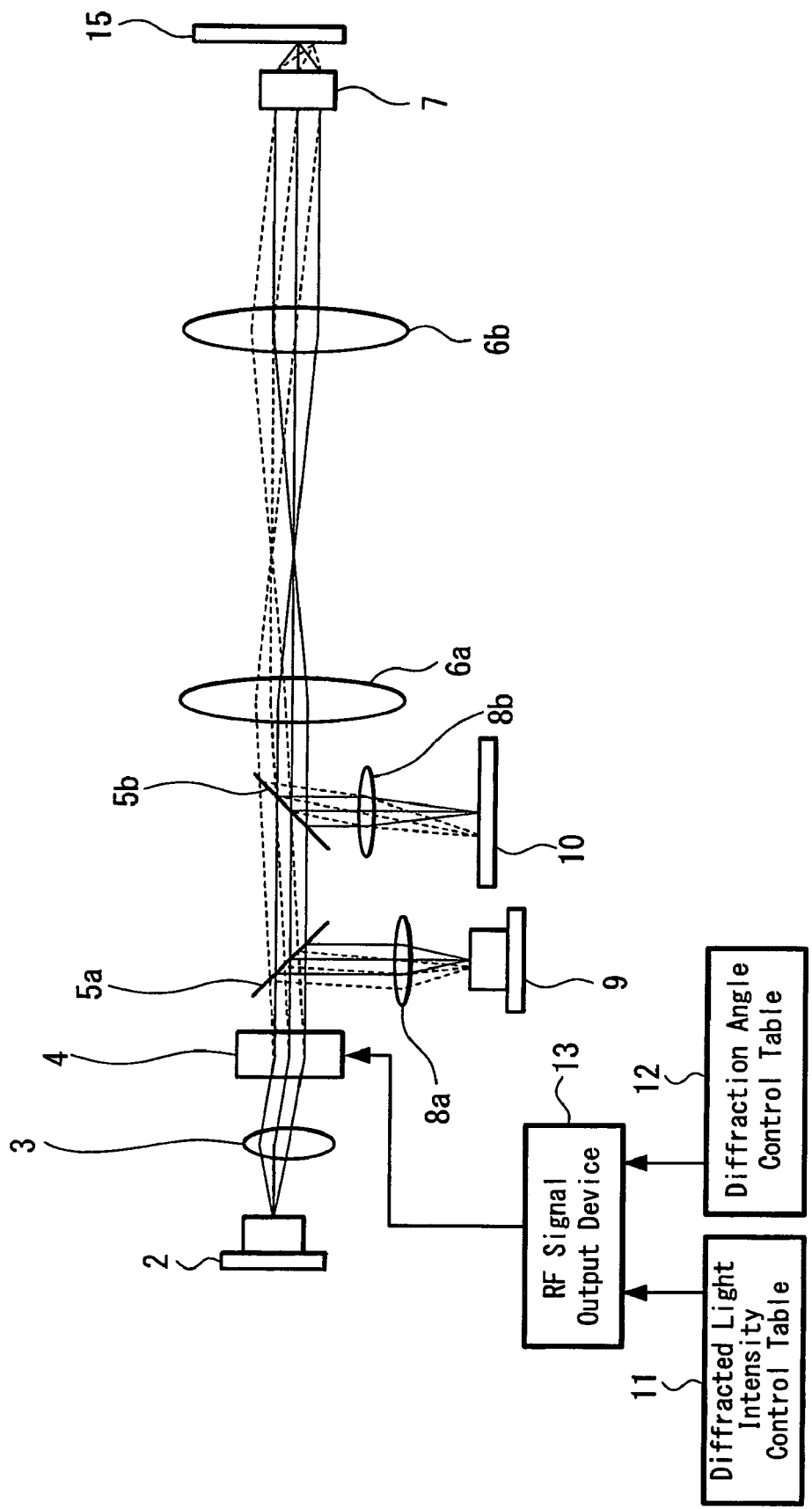
FIG. 3 is a diagram illustrating a laser drawing apparatus according to an embodiment of the present invention.

FIG. 3 illustrates a laser drawing apparatus according to an embodiment of the present invention. A laser drawing apparatus 1 according to this embodiment includes a laser light source 2 emitting a laser light and an AOD 4 diffracting and thereby deflecting the laser light incident from the light source 2 to be emerged as a diffracted light. The laser drawing apparatus 1 further includes a first fθ lens group 6a and a second fθ lens group 6b constituting an afocal-relay optical system serving as an intermediate optical lens system, and an object lens 7 opposing a sample 15 as an object to be processed. The object lens 7 is a condensing lens. The diffracted laser light emerged from the AOD 4 is condensed as an optical spot of the diffracted laser light on the sample 15 by the first fθ lens group 6a, the second fθ lens group 6b, and the object lens 7. A collimator lens 3 is arranged between the laser light source 2 and the AOD 4 to make the laser light to a parallel light. For the laser light source 2, for example, a semiconductor laser may be used.

A first beam splitter 5a and a second beam splitter 5b are arranged on a light path between the AOD 4 and the first θ lens group 6a. A portion of a diffracted light emerged from the AOD 4 is reflected by the first beam splitter 5a and is received through a first condensing lens 8a on a photodiode 9 serving as a diffracted light intensity detection device detecting the light intensity of a diffracted light. Thereby, the light intensity of the diffracted light is detected with the photodiode 9. A return light of the diffracted light emerged from the AOD 4, passed through respective lenses (the first fθ lens group 6a, the second fθ lens group 6b, and the object lens 7), and reflected by the object to the processed (the sample 15) is reflected by the second beam splitter 5b and is received, through a second condensing lens 8b, by a position detection device 10 serving as a position detection device detecting the position of an optical spot of the diffracted light on the sample 15. Thereby, a position of the optical spot of the diffracted light on the object is detected.

The laser drawing apparatus 1 further includes an RF signal output device 13 outputting an RF signal to be inputted to the AOD 4 to diffract a laser light incident to the AOD 4. As described later, the RF signal output device 13 supplies the RF signal to the AOD 4 while controlling the amplitude and/or frequency of the RF signal so as to make the light intensity of a diffracted light emerging from the AOD 4 constant independent of the diffraction angle of the diffracted light and/or to change the diffraction angle of the diffracted light at a constant speed to thereby move the position of an optical spot of the diffracted light on the sample 15 at a constant speed. The RF signal output device 13 controls the frequency and/or amplitude of an outputting RF signal by referring to a diffracted light intensity control table 11 for controlling the light intensity of a diffracted light emerging from the AOD 4 so as to be constant independent of the diffraction angle of the diffracted light and/or a diffraction angle control table 12 for controlling the diffraction angle of the diffracted light so as to be changed at a constant speed. The diffracted light intensity control table 11 to be referred to for controlling the light intensity of a diffracted light emerging from the AOD 4 and the diffraction angle control table 12 to be referred to for controlling the diffraction angle of the diffracted light are stored in a storage unit not shown.

In the diffracted light intensity control table 11, control values for controlling the light intensity of a diffracted light emerging from the AOD 4 so as to be constant independent of the diffraction angle of the diffracted light are stored. The values to be stored in the diffracted light intensity control table 11 are prepared in advance as described later using the photodiode 9. Further, in the diffraction angle control table 12, control values for controlling the diffraction angle of a diffracted light emerging from the AOD 4 so as to be changed at a constant speed are stored. The values to be stored in the diffraction angle control table 12 are prepared in advance using the position detection device 10.

The first fθ lens group 6*a* may be constituted for example by two pieces of lenses in one group, and the second fθ lens group 6*b* may be constituted for example by four pieces of lenses in three groups. The first fθ lens group 6*a* and the second fθ lens group 6*b* are arranged to oppose to each other so that respective rear-side focal points agree with each other and a front-side focal point of the first fθ lens group 6*a* is caused to agree with a diffraction position of the AOD 4 and a front-side focal point of the second fθ lens group 6*b* is caused to agree with the position of an incident pupil of the object lens 7. Thereby, the first fθ lens group 6*a* and the second fθ lens group 6*b* functions as an afocal-relay optical system having little aberration.

Now, using the above-described laser drawing apparatus 1, a laser drawing method according to an embodiment of the present invention is described.

As illustrated in FIG. 3, the light source 2 emits a laser light. For the laser light, for example a blue color laser light having the wavelength of 405 nm may be used. The laser light emitted from the light source 2 is made a parallel light by the collimator lens 3 converting a divergent light into a parallel light. The laser light converted to a parallel light enters the AOD 4, which ejects a first order diffracted light of the laser light (hereinafter, referred to as a diffracted light). The diffracted light emerging from the AOD 4 is used as a drawing laser beam, for example as a beam for exposure, and is caused to scan on the sample 15 as the diffracted light is diffracted and thereby deflected within a predetermined angle range by an RF signal inputted to the AOD 4. The deflecting direction of the diffracted light can be controlled by changing of the frequency of the RF signal to be inputted to the AOD 4.

The diffracted light emerged from the AOD 4 passes through the first fθ lens group 6*a* and the second fθ lens group 6*b* and is condensed by the object lens 7 to be irradiated on the sample 5 and at the same time, is caused to scan on the sample 15 based on deflection of the diffracted light at the AOD 4, and thereby laser drawing is conducted. In this embodiment, the range of a diffraction angle of a diffracted light emerging from the AOD 4, i.e., the deflection angle of the diffracted light, is set to a predetermined range. In this embodiment, the diffraction angle is set at about 35 mrad. In this case, the optical axis is deviated about ±3.5 mm on the incident surface of the object lens 7, which is 200 mm from the diffraction position of the AOD 4.

If the incident pupil diameter of the object lens 7 which stops down the diffracted light irradiating the sample 15 is Φ3.8 mm, the diffracted light hardly enters the incident pupil of the object lens 7. Therefore, in this embodiment, the diffracted light is caused by the afocal-relay optical system constituted by the first fθ lens group 6*a* and the second fθ lens group 6*b* to be incident to the incident pupil of the object lens 7 at a position corresponding to the diffraction position of the AOD 4. Then, the whole portion of the diffracted light is caused to be incident to the incident pupil of the object lens 7 and is condensed onto the sample 15.

The RF signal output device 13 reads out the diffracted light intensity control table 11 and/or the diffraction angle control table 12 and controls an RF signal to be inputted to the AOD 4 so as to keep the light intensity of a diffracted light emerging from the AOD 4 constant independent of the diffraction angle of the diffracted light and/or to change the diffraction angle of the diffracted light at a constant speed based on the diffracted light intensity control table 11 and/or the diffraction angle control table 12. The relation between the diffracted light intensity control table 11 and the diffraction angle control table 12 and changes in the intensity and the diffraction angle of a diffracted light emerging from the AOD 4 will be described later.

Next, methods of preparing the diffracted light intensity control table 11 and the diffraction angle control table 12 are described. The diffracted light intensity control table 11 and the diffraction angle control table 12 are prepared using the laser drawing apparatus 1.

First, a method of preparing the diffracted light intensity control table 11 using the laser drawing apparatus 1 is described. A portion of a diffracted laser light emerged from the AOD 4 is reflected by the first beam splitter 5*a* splitting a light flux and is converged to the first condensing lens 8*a*. The laser light converged to the first condensing lens 8*a* is condensed to the photodiode 9 converting a detected light into an electric signal. Thereby, the light intensity of the diffracted light is detected. At this time, alignment of the first beam splitter 5*a*, the first condensing lens 8*a*, and the photodiode 9 is adjusted so that a diffracted light at each of arbitrary diffraction angles (described later) is detected by the photodiode 9. Then, based on a detection result of the diffracted light intensity detection device, i.e., the light intensity of a diffracted light for each diffraction angle, the diffracted light intensity control table 11 is prepared (described in detail later).

Next, an exemplary method of preparing the diffraction angle control table 12 using the laser drawing apparatus 1 is described. A diffracted light emerged from the AOD 4 and passed through the object lens 7 is converged on a surface of the sample 15. A return light of the diffracted light reflected by the sample 15 passes the object lens 7, the second fθ lens group 6*b*, and the first fθ lens group 6*a* in that order, and a portion of the return light passed the first fθ lens group 6*a* is reflected by the second beam splitter 5*b* and is converged to the second condensing lens 8*b*. The return light converged by the second condensing lens 8*b* is received by the position detection device 10 detecting the position of a condensed optical spot of the diffracted light on the sample 15 and thereby a position of the optical spot of the diffracted light on the sample 15 is detected. Then, based on a detection result with the position detection device 10, a relation of the frequency of an RF signal inputted to the AOD 4 to diffract an incident laser light and the position on the sample 15 of the optical spot of the diffracted light is obtained. At this time, alignment of the second beam splitter 5*b*, the second condensing lens 8*b*, and the position detection device 10 is adjusted so that a diffracted light at each of arbitrary diffraction angles (frequencies of the RF signal) is detected by the position detection device 10. Then, based on the relation of the frequency of the RF signal and the position on the sample 15 of the optical spot of the diffracted light, the diffraction angle control table 12 is prepared (described in detail later).

Here, the RF signal output device 13 outputting an RF signal to the AOD 4 controls the amplitude and/or the frequency of the RF signal using the diffracted light intensity control table 11 and/or the diffraction angle control table 12, and thereby the intensity and/or the diffraction angle of a diffracted light emerging from the AOD 4 are controlled.

Figure 4:
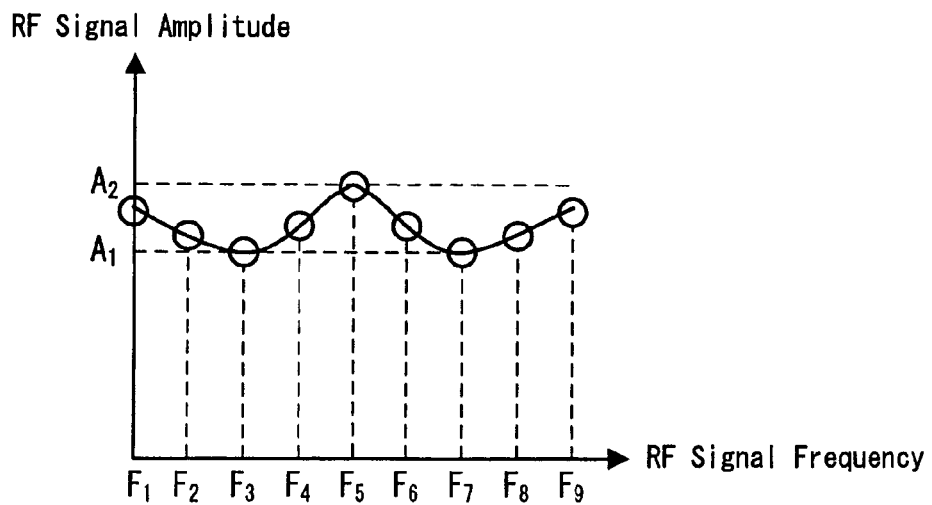
FIG. 4 is a diagram for explaining a diffracted light intensity control table used in the laser drawing apparatus.

Next an example of the diffracted light intensity control table 11 used in the laser drawing apparatus 1 according to this embodiment of the present invention is described in detail referring to FIG. 4.

Figure 1:
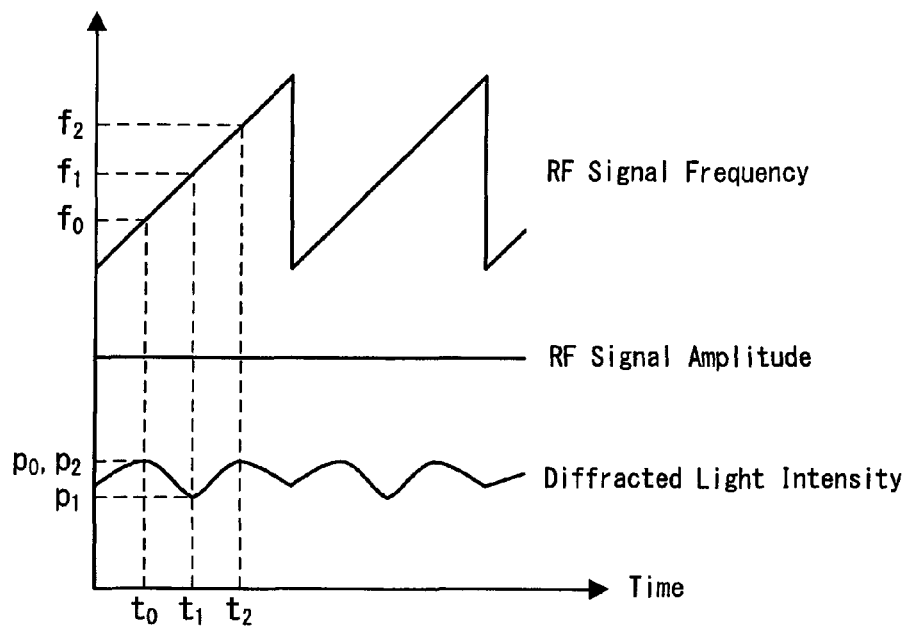
FIG. 1 is an explanatory diagram illustrating an example of a light intensity of a diffracted laser light according to related art.

As described above, because the diffraction efficiency (the light intensity of a diffracted light/the light intensity of an incident light to the AOD 4) changes depending on the diffraction angle, the light intensity of a diffracted light changes depending on the diffraction angle of the diffracted light, and as a result, exposure unevenness is caused on the sample 15. And, as described above, as the frequency of an RF signal supplied to the AOD 4 increases, the diffracted light intensity changes (see FIG. 1). In the laser drawing apparatus 1 in this embodiment, the amplitude of the RF signal supplied to the AOD 4 is controlled such that the light intensity of a diffracted light emerging from the AOD 4 is kept constant independent of the diffraction angle of the diffracted light.

In the diffracted light intensity control table 11, first frequency instructing values specifying a range of frequencies of an RF signal to be inputted to the AOD 4 to change the diffraction angle of an incident light are recorded in advance. Further, in this embodiment, 9 dividing points $F_1$-$F_9$ that divides the range of frequencies of the RF signal in 8 equal parts are provided. A range of diffraction angles of the laser light incident to the AOD 4 is determined (for example, to 35 mrad) based on the first frequency instructing values.

When preparing the diffracted light intensity table 11 using the laser drawing apparatus 1, the RF signal output device 13 controls the frequency of the RF signal to be inputted to the AOD 4 based on the first frequency instructing values of the diffracted light intensity table 11. In a state that the amplitude of the RF signal is set to a possible maximum value, the light intensity of a diffracted light emerging from the AOD 4 is detected with the photodiode 9 for each diffraction angle (for each frequency of 9 dividing points), and based on a detection result, values of the diffraction efficiency (the light intensity of a diffracted light/the light intensity of an incident light to the AOD 4) are obtained for respective diffraction angles (frequencies), and inverse numbers of the obtained diffraction efficiency values are determined for respective diffraction angles (frequencies). Inverse numbers of diffraction efficiency values with respect to diffraction angles (frequencies) deviated from the dividing points $F_1$-$F_9$ are supplemented by a spline curve. Then, a diffraction angle (frequency) at which the detected diffracted light intensity is the lowest is taken as a criterion, and values proportional to respective inverse numbers of the obtained diffraction efficiency values are determined such that the light intensity of the diffracted light at each diffraction angle (frequency) becomes the same as the lowest. The values proportional to the inverse numbers of the diffraction efficiency values for respective diffraction angles (frequencies) of the diffracted light are stored in the diffracted light intensity control table 11 as amplitude control values for respective frequencies of the RF signal.

The RF signal output device 13 reads out the amplitude control values from the diffracted light intensity control table 11 and controls the amplitude of the RF signal to be outputted according to the amplitude control values, and thereby it becomes possible to control the light intensity of the diffracted light emerging from the AOD 4. Because the inverse numbers of diffraction efficiency values with respect to diffraction angles (frequencies) deviated from the dividing points $F_1$-$F_9$ are supplemented by a spline curve, even when the laser light is diffracted at a diffraction angle where the light intensity of the diffracted light has not been not actually detected with the photodiode 9, it is possible to keep the diffracted light intensity substantially constant.

Figure 5:
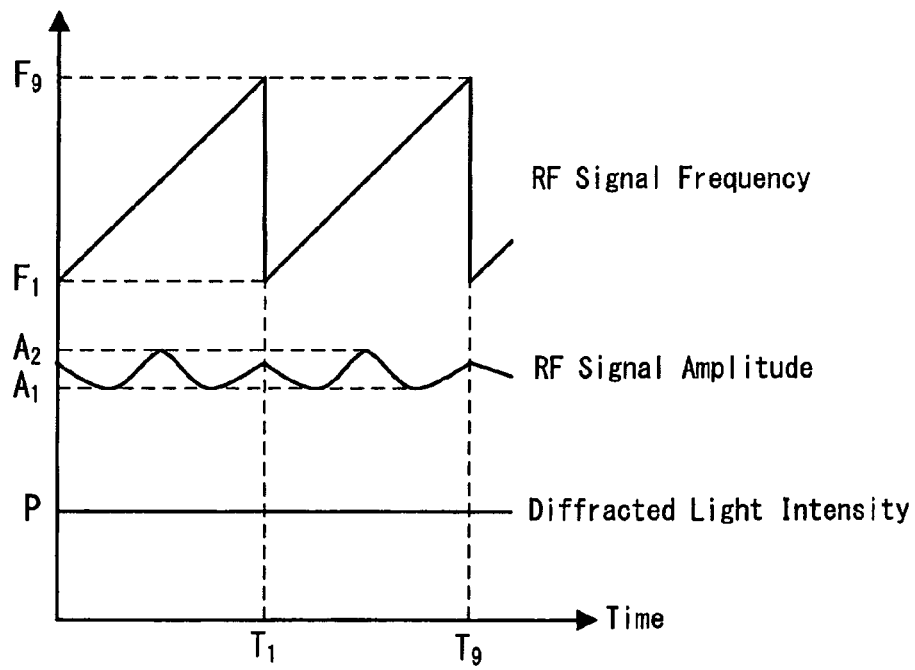
FIG. 5 is a diagram for explaining a relation of the frequency and amplitude of an RF signal inputted to an AOD of the laser drawing apparatus based on the diffracted light intensity control table, and a light intensity of a diffracted light emerging from the AOD.

FIG. 5 illustrates a relation between the frequency of an RF signal inputted to the AOD 4 and the light intensity of a diffracted light emerging from the AOD 4 when the amplitude of the RF signal has been controlled based on the diffracted light intensity control table 11.

The RF signal output device 13 reads out the first frequency instructing values from the diffracted light intensity control table 11. Then, in response to the change in the frequency, the amplitudes of the RF signal at 9 dividing points $F_1$-$F_9$ of the frequency range are controlled based on the amplitude control values of the diffracted light intensity control table 11. The frequency of the RF signal outputted by the RF signal output device 13 changes from the lower limit value $F_1$ to the upper limit value $F_9$ between time $T_1$ and time $T_9$ and at this time, the amplitude of the RF signal changes between the lower limit value $A_1$ and the upper limit value $A_2$ as illustrated in FIG. 5. Thus, the amplitude of the RF signal is controlled in response to the frequency of the RF signal, and thereby the light intensity of a diffracted light emerging from the AOD 4 is controlled to be at a fixed value P.

Figure 6:
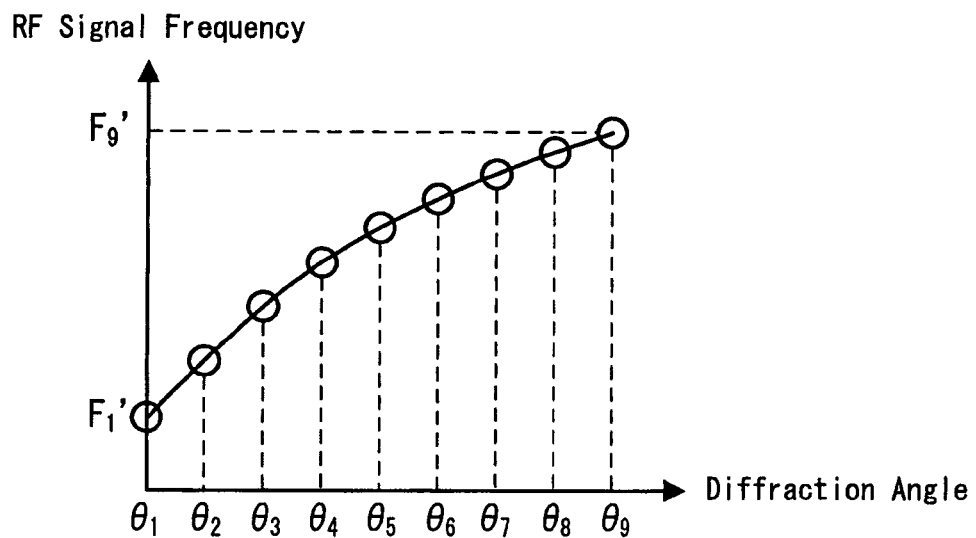
FIG. 6 is a diagram for explaining a diffraction angle control table used in the laser drawing apparatus.

Next, an example of the diffraction angle control table 12 used in the laser drawing apparatus 1 according to this embodiment of the present invention is described more in detail referring to FIG. 6.

Figure 2:
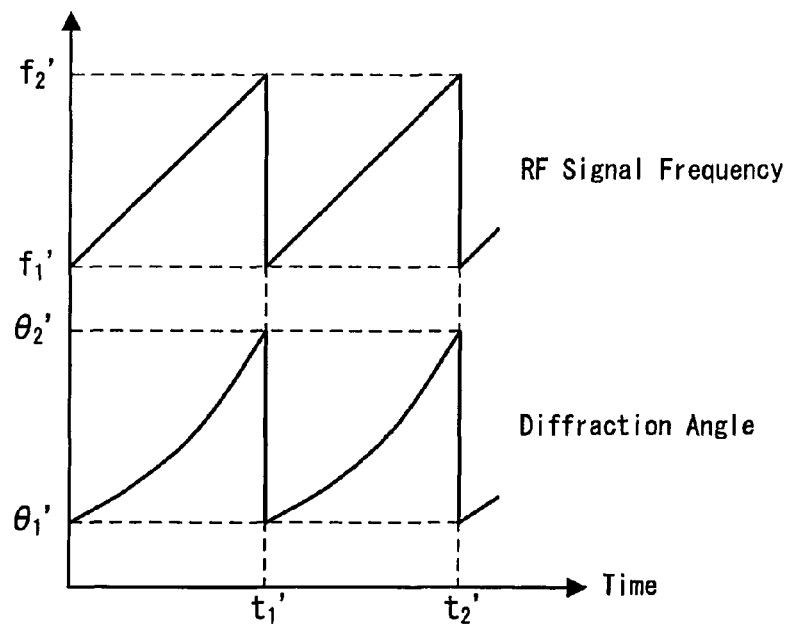
FIG. 2 is an explanatory diagram illustrating an example of a diffraction angle of a diffracted laser light according to related art.

As described above, as the diffraction angle of a diffracted light emerging from the AOD 4 changes with changing of the frequency of an RF signal to be inputted to the AOD 4, the position on the sample 15 of a condensed optical spot of a diffracted light emerging from the AOD 4 is moved. Meanwhile, even if the frequency of an RF signal is linearly changed, the diffraction angle does not change at a constant speed (see FIG. 2), and there is a possibility that exposure unevenness is caused on the sample 15. Therefore, in the laser drawing apparatus 1 in this embodiment, for changing the diffraction angle of a diffracted light emerging from the AOD 4 at a constant speed, the frequency of an RF signal to be inputted to the AOD 4 is controlled based on the diffraction angle control table 12.

In the diffraction angle control table 12, for changing the diffraction angle of an incident laser light, second frequency instructing values specifying frequencies of an RF signal to be inputted to the AOD 4 are recorded in advance. Based on the second frequency instructing values, a range of frequencies of an RF signal to be inputted to the AOD 4 is determined. Further, in this embodiment, 9 dividing points that divide the range of frequencies of the RF signal based on the second frequency instructing values in 8 equal parts are provided.

When preparing the diffraction angle control table 12 using the laser drawing apparatus 1, the RF signal output device 13 supplies an RF signal based on the second frequency instructing values of the diffraction angle control table 12 to the AOD 4. Then, the position information of an optical spot of a diffracted light emerging from the AOD 4 for each of 9 dividing points of the range of frequencies of the RF signal is obtained with the position detection device 10, and based on the obtained position information, frequencies of the RF signal to be inputted to the AOD 4 to obtain desired diffraction angles of the diffracted light (desired positions of the optical spot of the diffracted light on the object) are sequentially determined. The frequencies of the RF signal between respective dividing points are supplemented by a spline curve. FIG. 6 illustrates a relation between frequencies $F'_1$-$F'_9$ thus determined and corresponding diffraction angles $\theta_1$-$\theta_9$. In the diffraction angle control table 12, values specifying the frequencies of the RF signal thus determined are stored as frequency control values.

The RF signal output device 13 reads out the frequency control values of the diffraction angle control table 12 and controls the frequency of the RF signal to be inputted to the ADO 4 according to the frequency control values. The frequency control values of the diffraction angle control table 12 may be read out in a constant time sequentially from the one for the smaller or larger diffraction angle. Because the frequencies of the RF signal between respective dividing points are supplemented by a spline curve, even when the laser light is diffracted at a diffraction angle where the position of an optical spot of the diffracted light on the object 15 has not been not actually detected with the position detection device 10, the diffraction angle of a diffracted light emerging from the AOD 4 is changed at a constant speed and thereby the optical spot of the diffracted laser light on the sample 15 is moved at a constant speed.

Figure 7:
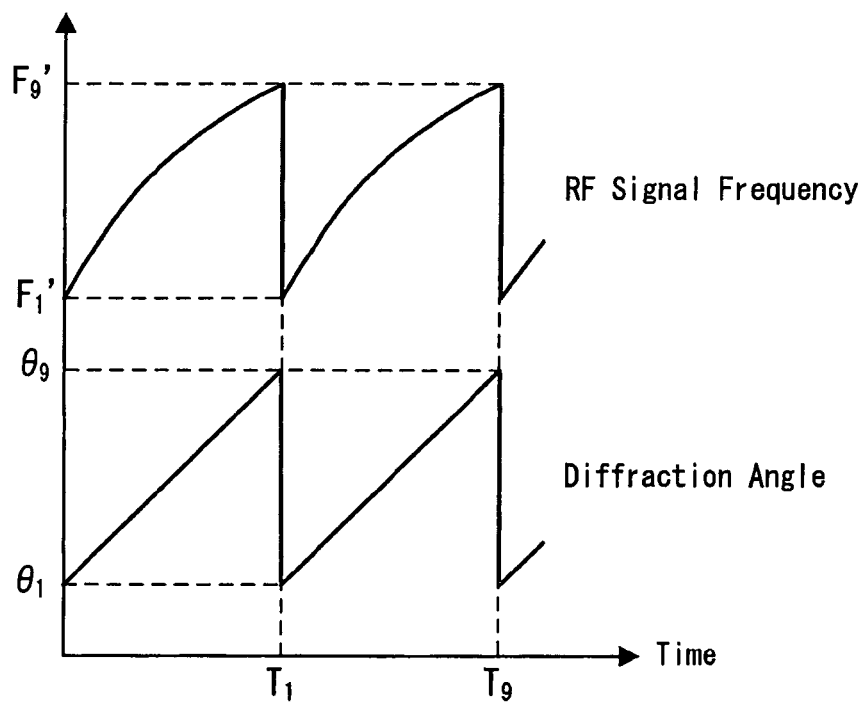
FIG. 7 is a diagram for explaining a relation of the frequency of an RF signal inputted to the AOD based on the diffraction angle control table, and a diffraction angle of a diffracted light emerging from the AOD.

FIG. 7 illustrates a relation between the frequency of an RF signal inputted to the AOD 4 and the diffraction angle of a diffracted light emerging from the AOD 4 when the frequency of the RF signal has been controlled based on the frequency control values of the diffraction angle control table 12.

The RF signal output device 13 reads out the frequency control values from the diffraction angle control table 12 and controls the frequency of the RF signal to be inputted to the AOD 4 according to the frequency control values. The frequency of the RF signal outputted by the RF signal output device 13 is changed between time $T_1$ and time $T_9$ from the lower limit value $F_1'$ to the upper limit value $F_2'$ and at this time the diffraction angle of a diffracted light changes between the lower limit value $\theta_1$ and the upper limit value $\theta_2$ as illustrated in FIG. 7. Thus, the diffraction angle of a diffracted light emerging from the AOD 4 is changed at a constant speed in response to the change in the frequency of the RF signal based on the diffraction angle control table 12, and thereby the position of an optical spot of the diffracted light on the object is changed at a constant speed.

Generally, in a diffraction optical system using an AOD, an ultrasonic wave is generated in the AOD with an RF signal inputted to the AOD and a laser light incident to the AOD is diffracted by a wave surface of the ultrasonic wave, so that it is difficult to feed back a result of detecting the light intensity of a diffracted light with a diffracted light intensity detection device to control the RF signal. Therefore, in this embodiment, the diffracted light intensity control table 11 and/or the diffraction angle control table 12 are prepared in advance and are stored in the laser drawing apparatus 1. Then, without feeding back a result of detecting the light intensity of a diffracted light with the photodiode 9 and/or the position of an optical spot of the diffracted light on the sample 15 with the position detection device 10, the amplitude and/or the frequency of an RF signal to be inputted to the AOD 4 can be properly controlled. As a result of this, it becomes possible to keep the light intensity of a diffracted light emerging from the AOD 4 constant and to change the diffraction angle of the diffracted light at a constant speed.

Figure 8:
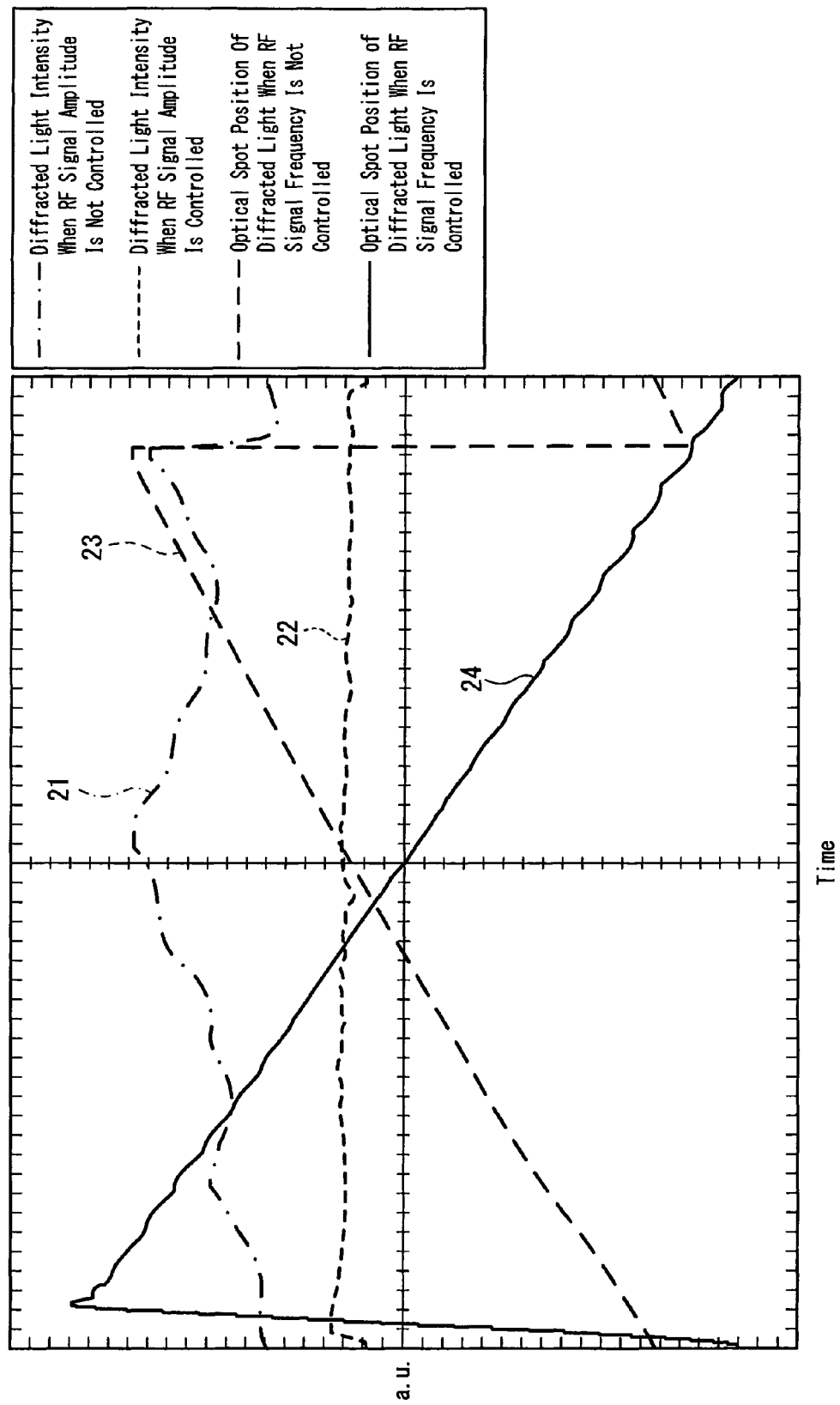
FIG. 8 is a diagram illustrating results of detecting with a photodiode and a position detection device of the laser drawing apparatus, the light intensity of a diffracted light when the RF signal is controlled and when the RF signal is not controlled, based on the diffracted light intensity control table, and the position of an optical spot of the diffracted light on an object to be processed when the RF signal is controlled and when the RF signal is not controlled, based on the diffraction angle control table.

Here, actual results of detecting the light intensity of a diffracted light emerging from the AOD 4 and the position of an optical spot of the diffracted light on the sample 15 using the photodiode 9 and the position detection device 10 are described referring to FIG. 8. The cycle of the RF signal outputted by the RF signal output device 13 is set to 100 μsec. FIG. 8 illustrates waveforms displayed on an oscilloscope.

A waveform 21 illustrates the light intensity of a diffracted light emerging from the AOD 4 when the amplitude of an RF signal to be inputted to the AOD 4 is not controlled based on the diffracted light intensity control table 11. The waveform 21 is slightly asymmetrical due to deviation in optical adjustment. A waveform 22 illustrate the light intensity of a diffracted light emerging from the AOD 4 when the amplitude of the RF signal to be inputted to the AOD 4 has been controlled based the diffracted light intensity control table 11. From the waveform 22, it is understood that the light intensity of the diffracted light is kept at a substantially fixed value.

A waveform 23 illustrates the position on the sample 15 of an optical spot of a diffracted light emerging from the AOD 4 when the frequency of an RF signal to be inputted to the AOD 4 is not controlled based on the diffraction angle control table 12. The waveform 23 is in a gentle curve in substantially a linear shape. A waveform 24 illustrates the position on the sample 15 of a diffracted light emerging from the AOD 4 when the frequency of the RF signal has been controlled based on the diffraction angle control table 12. It is understood from the waveform 24 that the position of the optical spot of the diffracted light on the sample 15 changes substantially at a constant speed.

According to the above-described embodiment, the RF signal output device 13 controls the amplitude of an RF signal to be inputted to the AOD 4 based on the diffracted light intensity control table 11, and thereby the light intensity of a diffracted light emerging from the AOD 4 is kept constant independent of the diffraction angle of the diffracted light. Also, the RF signal output device 13 controls the frequency of an RF signal to be inputted to the AOD 4 based on the diffraction angle control table 12, and thereby the diffraction angle of a diffracted light emerging from the AOD 4 is changed at a constant speed, that is, the angular speed of the diffracted light is kept constant, and thereby the position of an optical spot of the diffracted light on the sample 15 is moved at a constant speed. Thus, for example, in anneal processing a sample, exposure unevenness is avoided in the micro-fabricated sample.

When the diffraction angles vary depending on AODs or the coupling efficiencies varies depending on optical systems, respective instructing values and control values of the diffracted light intensity control table 11 and the diffraction angle control table 12 may be appropriately adjusted.

Furthermore, in related art laser drawing apparatuses in which an irradiated laser light is made directly incident on an object lens, it occurs that an optical axis of an optical system is deviated. Then, when an AOD that can obtain a relatively large diffraction angle is used, the whole portion of a diffracted light emerging from the AOD does not enter the incident pupil of the object lens, and thereby the light intensity of the diffracted light greatly decreases. On the other hand, in the laser drawing apparatus 1 of this embodiment, with the provision of the intermediate optical lens system as an afocal-relay optical system, the optical axis of a diffracted light emerging from the AOD 4 and incident on the object lens 7 can be caused to agree with the center of the incident pupil of the object lens 7 independent of the diffraction angle of the diffracted light. Thereby, the above-described problem occurring in the related art laser drawing apparatuses is avoided.

According to the above-described embodiment of the present invention, the RF signal to be inputted to the AOD 4 may be controlled based on either of or both of the diffracted light intensity control table 11 and the diffraction angle control table 12. When preparing the diffracted light intensity control table 11 for controlling the RF signal based on both of the diffracted light intensity control table 11 and the diffraction angle control table 12, the frequencies of the RF signal determined based on the frequency control values of the diffraction angle control table 12 are used for the first frequency instructing values of the diffracted light intensity control table 11. Then, the RF signal output device 13 controls the frequency of the RF signal to be inputted to the AOD 4 based on the frequency control values of the diffraction angle control table 12 serving as the first frequency instructing values of the diffracted light intensity control table 11, and thereby amplitude control values for respective frequencies of the RF signal are obtained in a similar manner as described above.

In the above-described embodiment, when preparing the diffracted light intensity control table 11, the values proportional to respective inverse numbers of the obtained diffraction efficiency values as the amplitude control values are determined such that the light intensity of the diffracted light at each diffraction angle (frequency) other than the criterion diffraction angle (frequency) becomes the same as the lowest. However, the values proportional to respective inverse numbers of the obtained diffraction efficiency values as the amplitude control values may be determined otherwise appropriately, for example depending upon the kind of the sample 15.

Further, in the diffracted light intensity control table 11 and the diffraction angle control table 12, 9 dividing points dividing the frequency of an RF signal are provided, respectively, however, the number of diving points for one cycle of the RF signal is not limited to 9 points (8 divided parts). For example, the number of dividing points may be 5 points (4 divided parts) or 41 points (40 divided parts).

Furthermore, the lens group constituting the intermediate optical lens system of the laser drawing apparatus 1 is constituted by an fθ lens group, however, it may be constituted by a lens group other than the fθ lens group as long as the positional relationship between the AOD 4 and the incident pupil surface of a final condensing lens in the previous stage of the sample 15 (in this embodiment, the object lens 7) is similar to that of an afocal-relay optical system.

Further, the laser drawing apparatus 1 has been described as an example for a case that it is used in laser annealing for making a thin film transistor, which is used, for example, in a liquid crystal display apparatus, however, the laser drawing apparatus 1 may be configured to produce a wire-grid polarizer by inscribing thin parallel grooves at equal intervals on the surface of a glass and by arranging wirings in the grooves to deflect specific light rays. The laser drawing 1 may be used for other micro-fabrication.

The present invention is not limited to the above-described respective embodiments and may have various other arrangements without departing from the gist of the present invention.

It should be understood by those skilled in the art that various modifications, combinations, sub-combinations and alterations may occur depending upon design requirements and other factors insofar as they are within the scope of the appended claims or the equivalents thereof.

What is claimed is:

1. A method of laser drawing for laser annealing of semiconductor devices, comprising:
    causing laser light from a light source to be incident on an acousto-optical diffraction element; and
    deflecting the light incident on the acousto-optical diffraction element by changing a frequency of a high frequency signal inputted to the acousto-optical diffraction element, thereby changing a diffraction angle of the diffracted light, and condensing the diffracted light emerging from the acousto-optical diffraction element through an intermediate optical lens system and a condensing lens on an object to be processed as an optical spot of the diffracted light, thereby scanning the object with the optical spot of the diffracted light, wherein
    diffracted light intensity control data for controlling an amplitude of the high frequency signal inputted to the acousto-optical diffraction element so as to keep a light intensity of the diffracted light emerging from the acousto-optical diffraction element constant independent of the diffraction angle based on determined device operation information, and wherein
    the amplitude of the high frequency signal inputted to the acousto-optical diffraction element is controlled based on the diffracted light intensity control data, thereby the light intensity of the diffracted light emerging from the acousto-optical diffraction element is kept constant independent of the diffraction angle of the diffracted light, wherein the diffracted light intensity control data includes frequency instructing values specifying frequencies of the high frequency signal inputted to the acousto-optical diffraction element and amplitude control values for controlling the amplitude of the high frequency signal so as to keep the light intensity of the diffracted light emerging from the acousto-optical diffraction element constant independent of the diffraction angle of the diffracted light, the amplitude control values being related to inverse diffraction efficiency values when the diffraction angle of the diffracted light emerging from the acousto-optical diffraction element is changed by changing the frequency of the high frequency signal input to the acousto-optical diffraction element.

2. The method of claim 1, wherein the diffracted light intensity control data is prepared using a diffracted light intensity detection device receiving a portion of the diffracted light emerging from the acousto-optical diffraction element and detecting a light intensity of the diffracted light for signals input to the acousto-optical diffraction element.

3. The method of claim 1, wherein the intermediate optical lens system is an afocal-relay optical system.

4. A method of laser drawing for laser annealing used in microfabrication of semiconductor devices comprising:
    causing a laser light from a light source to be incident to on an acousto-optical diffraction element; and
    deflecting the light incident on the acousto-optical diffraction element by changing a frequency of a high frequency signal inputted to the acousto-optical diffraction element to diffract the light, thereby changing a diffraction angle of the diffracted light, and condensing the diffracted light emerging from the acousto-optical diffraction element through an intermediate optical lens system and a condensing lens on an object to be processed as an optical spot of the diffracted light, thereby scanning the object with the optical spot of the diffracted light, wherein
    diffraction angle control data for controlling the frequency of the high frequency signal inputted to the acousto-optical diffraction element so as to change the diffraction angle of the diffracted light emerging from the acousto-optical diffraction element at a constant rate, and wherein
    the frequency of the high frequency signal inputted to the acousto-optical diffraction element is controlled based on the diffraction angle control data, thereby the diffraction angle of the diffracted light emerging from the acousto-optical diffraction element is changed at a constant rate, so that the position of the optical spot of the diffracted light on the object is changed at a constant rate.

5. The method of claim 4, wherein the diffraction angle control data includes frequency control values for controlling the frequency of the high frequency signal inputted to the acousto-optical diffraction element so as to change the diffraction angle of the diffracted light emerging from the acousto-optical diffraction element at a constant rate.

6. The method of claim 4, wherein the diffraction angle control data is prepared using a position detection device receiving a reflected light of the diffracted light emerging from the acousto-optical diffraction element and reflected from the object and detecting a position of the optical spot of the diffracted light on the object for each frequency of the high frequency signal inputted to the acousto-optical diffraction element.

7. The method of claim 4, wherein the intermediate optical lens system is an afocal-relay optical system.

8. A laser drawing apparatus for laser annealing of semiconductor devices comprising:
 a laser light source emitting a laser light;
 an acousto-optical diffraction element diffracting the light incident from the light source to be emerged as a diffracted light, with inputting of a high frequency signal;
 an intermediate optical lens system and a condensing lens, condensing the diffracted light emerging from the acousto-optical diffraction element on an object to be processed as an optical spot;
 a high frequency signal output device outputting the high frequency signal inputted to the acousto-optical diffraction element, the high frequency signal output device changing a frequency of the high frequency signal inputted to the acousto-optical diffraction element to change a diffraction angle of the diffracted light emerging from the acousto-optical diffraction element, thereby deflecting the diffracted light emerging from the acousto-optical element to scan the object to be processed with the optical spot of the diffracted light;
 a diffracted light intensity detection device detecting a light intensity of the diffracted light emerging from the acousto-optical diffraction element; and
 diffracted light intensity control data for controlling an amplitude of the high frequency signal inputted to the acousto-optical diffraction element so as to keep a light intensity of the diffracted light emerging from the acousto-optical element constant independent of the diffraction angle of the diffracted light, the data being prepared in advance using the diffracted light intensity detection device, wherein
 the high frequency signal output device controls an amplitude of the high frequency signal inputted to the acousto-optical diffraction element based on the diffracted light intensity control data, thereby a light intensity of the diffracted light emerging from the acousto-optical diffraction element is kept constant independent of the diffraction angle of the diffracted light.

9. The apparatus of claim 8, wherein the intermediate optical lens system is an afocal-relay optical system.

10. A laser drawing apparatus for laser annealing of semiconductor devices comprising:
 a laser light source emitting a laser light;
 an acousto-optical diffraction element diffracting the light incident from the light source to be emerged as a diffracted light with inputting of a high frequency signal;
 an intermediate optical lens system and a condensing lens, condensing the diffracted light emerging from the acousto-optical diffraction element on an object to be processed as an optical spot;
 a high frequency signal output device outputting the high frequency signal inputted to the acousto-optical diffraction element and changing a frequency of the high frequency signal inputted to the acousto-optical diffraction element, the high frequency signal output device changing a diffraction angle of the diffracted light to thereby deflect the diffracted light to scan an object to be processed with the optical spot of the diffracted light;
 a position detection device detecting a position on the object of the optical spot of the diffracted light emerging from the acousto-optical diffraction element for each frequency of the high frequency signal inputted to the acousto-optical diffraction element; and
 diffraction angle control data for controlling the frequency of the high frequency signal inputted to the acousto-optical diffraction element so as to change the diffraction angle of the diffracted light emerging from the acousto-optical diffraction element at a constant rate, the data being prepared in advance using the position detection device, wherein
 the high frequency signal output device controls the frequency of the high frequency signal inputted to the acousto-optical diffraction element based on the diffraction angle control data, thereby the diffraction angle of the diffracted light emerging from the acousto-optical diffraction element is changed at a constant rate, so that a position of the optical spot of the diffracted light on the object is changed at a constant rate.

11. The apparatus of claim 10, wherein the intermediate optical lens system is an afocal-relay optical system.

* * * * *